(12) United States Patent
Thadesar et al.

(10) Patent No.: US 11,239,158 B1
(45) Date of Patent: Feb. 1, 2022

(54) WIRE BOND INDUCTOR STRUCTURES FOR FLIP CHIP DIES

(71) Applicant: QUALCOMM Incorporated, San Diego, CA (US)

(72) Inventors: Paragkumar Ajaybhai Thadesar, San Diego, CA (US); Changhan Hobie Yun, San Diego, CA (US); Sameer Sunil Vadhavkar, San Diego, CA (US); Daniel Daeik Kim, San Diego, CA (US); Francesco Carrara, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/066,154

(22) Filed: Oct. 8, 2020

(51) Int. Cl.
*H01L 23/522* (2006.01)
*H01L 23/66* (2006.01)
*H01L 23/00* (2006.01)

(52) U.S. Cl.
CPC .......... *H01L 23/5227* (2013.01); *H01L 23/66* (2013.01); *H01L 24/48* (2013.01); *H01L 24/49* (2013.01); *H01L 2223/6611* (2013.01); *H01L 2224/48227* (2013.01); *H01L 2924/1421* (2013.01); *H01L 2924/19042* (2013.01)

(58) Field of Classification Search
CPC ...... H01L 23/5227; H01L 23/66; H01L 24/48
See application file for complete search history.

(56) References Cited

U.S. PATENT DOCUMENTS

| 4,447,857 A * | 5/1984 | Marks | H05K 3/4015 361/739 |
| 5,519,582 A * | 5/1996 | Matsuzaki | H01L 23/645 336/208 |
| 5,696,031 A * | 12/1997 | Wark | H01L 25/0657 438/4 |
| 7,166,495 B2 * | 1/2007 | Ball | H01L 25/0657 257/E21.705 |
| 2004/0150968 A1 * | 8/2004 | Ravid | H01L 23/3128 361/777 |
| 2020/0211998 A1 * | 7/2020 | Uejima | H01L 23/552 |

* cited by examiner

*Primary Examiner* — Errol V Fernandes
(74) *Attorney, Agent, or Firm* — Seyfarth Shaw LLP

(57) ABSTRACT

An integrated circuit (IC) package comprising a first die, including an active layer opposite a backside surface of the first die supporting a plurality of backside pads is provided. The IC package also incorporates a package substrate coupled to the active layer. The package pads on the package substrate correspond to the plurality of backside pads. A passive device comprising a plurality of wire bonds is coupled to the plurality of backside pads and the plurality of package pads. The passive device may also comprise a plurality of wire bonds coupled to the package pads by through silicon vias (TSVs). Multiple dies may be coupled with die-to-die wire bonds coupled to backside pads on each die.

20 Claims, 11 Drawing Sheets

WIRE BOND INDUCTOR STRUCTURES FOR FLIP CHIP DIES

BACKGROUND

Field

Aspects of the present disclosure relate to semiconductor devices, and more particularly to wire bond inductors for flip chip dies.

Background

Wireless communication devices incorporate radio frequency (RF) modules that facilitate the communication and features users expect. As wireless systems become more prevalent and include more capabilities, the chips have become more complex to produce. Fifth generation (5G) wireless communication devices incorporate the latest generation of electronic dies that pack many features and devices into modules that are smaller and with increasingly smaller interconnections. As these modules increase in density, printed inductors are critical to performance and can occupy significant areas on the die.

Design challenges for mobile RF transceivers include analog/RF performance considerations, including mismatch, noise and other performance considerations. The design of these mobile RF transceivers includes the use of passive devices, such as inductors for example, to suppress resonance, and/or to perform filtering, bypassing, and coupling in high power, system on chip devices, such as application processors and graphics processors.

The use of printed inductors may take significant area on a laminate or package substrate and may also result in higher insertion loss and lower quality (Q)-factors. It is desirable to form wire bond inductors with flip chip dies that provide a higher Q-factor while reducing the area occupied on the laminate. The wire bond inductors may be used for very compact area RF matching, chokes for amplifiers, and resonant sections in 5G RF modules, which support multiple frequency bands.

For example, some duplexers in 5G RF modules may support as many as eight (8) frequency bands for simultaneous transmission and reception. These duplexers exhibit surface acoustic layer features that specify an increased filter size, which increase the size of the duplexers. Because of the acoustic characteristics, the mechanical structure of the duplexers is akin to a large capacitor. For example, the input and output of the duplexers are highly capacitive. Accordingly, inductors are used to reduce impedance of the duplexers to a desirable value (e.g., original impedance of 50 ohms for the low noise amplifier (LNA), antenna switch matrix, controller, and/or power amplifier). Multiple inductors are desirable within a small space to compensate for the high capacitance of the duplexers. The multiple inductors occupy an increased amount of space because a large area or volume is specified to generate a magnetic wave or flux, which generates the inductance value. It is desirable to provide a wire bond inductor that occupies less area on the laminate or package substrate and provides a high Q-factor.

SUMMARY

The disclosure provides an integrated circuit (IC) package. The package comprises a first die, including an active layer opposite a backside surface of the first die supporting a plurality of backside pads. A package substrate is coupled to the active layer. The package substrate comprises a plurality of package pads corresponding to the plurality of backside pads. A passive device comprised of a plurality of wire bonds coupled to the plurality of backside pads and the plurality of package pads completes the IC package.

A further aspect of the disclosure provides an integrated circuit (IC) package that includes a die with an active layer opposite a backside surface of the die, the active layer coupled to the backside surface of the die by through silicon vias (TSVs). A package substrate is coupled to the active layer, the package substrate corresponding to the plurality of backside pads. A passive device comprising a plurality of wire bonds coupled to the package pads through the TSVs completes the IC package.

The disclosure also provides a method of forming an inductor. The method comprises forming a plurality of backside pads on a backside of a die. Next, package bumps are formed on a front side of the die. The die is then assembled on a package substrate comprising a plurality of package pads corresponding to the plurality of backside pads. A wire bond is then coupled between the plurality of backside pads and the plurality of package pads.

A still further aspect of the disclosure provides an integrated circuit (IC) apparatus. The apparatus includes means for forming a plurality of backside pads on a backside of a die. Additionally, the apparatus includes means for forming package bumps on a front side of the die; means for assembling the die on a package substrate comprising a plurality of package pads corresponding to the plurality of backside pads; and means for coupling a wire bond between the plurality of backside pads and the plurality of package pads.

Aspects generally include a method, apparatus, system, computer program product, non-transitory computer-readable medium, user equipment, base station, wireless communications device, and processing system as substantially described with reference to and as illustrated by the accompanying drawings and specification.

The foregoing has outlined rather broadly the features and technical advantages of examples according to the disclosure in order that the detailed description that follows may be better understood. Additional features and advantages will be described. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed, both their organization and method of operation, together with associated advantages will be better understood from the following description when considered in connection with the accompanying figures. Each of the figures is provided for the purposes of illustration and description, and not as a definition of the limits of the claims.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
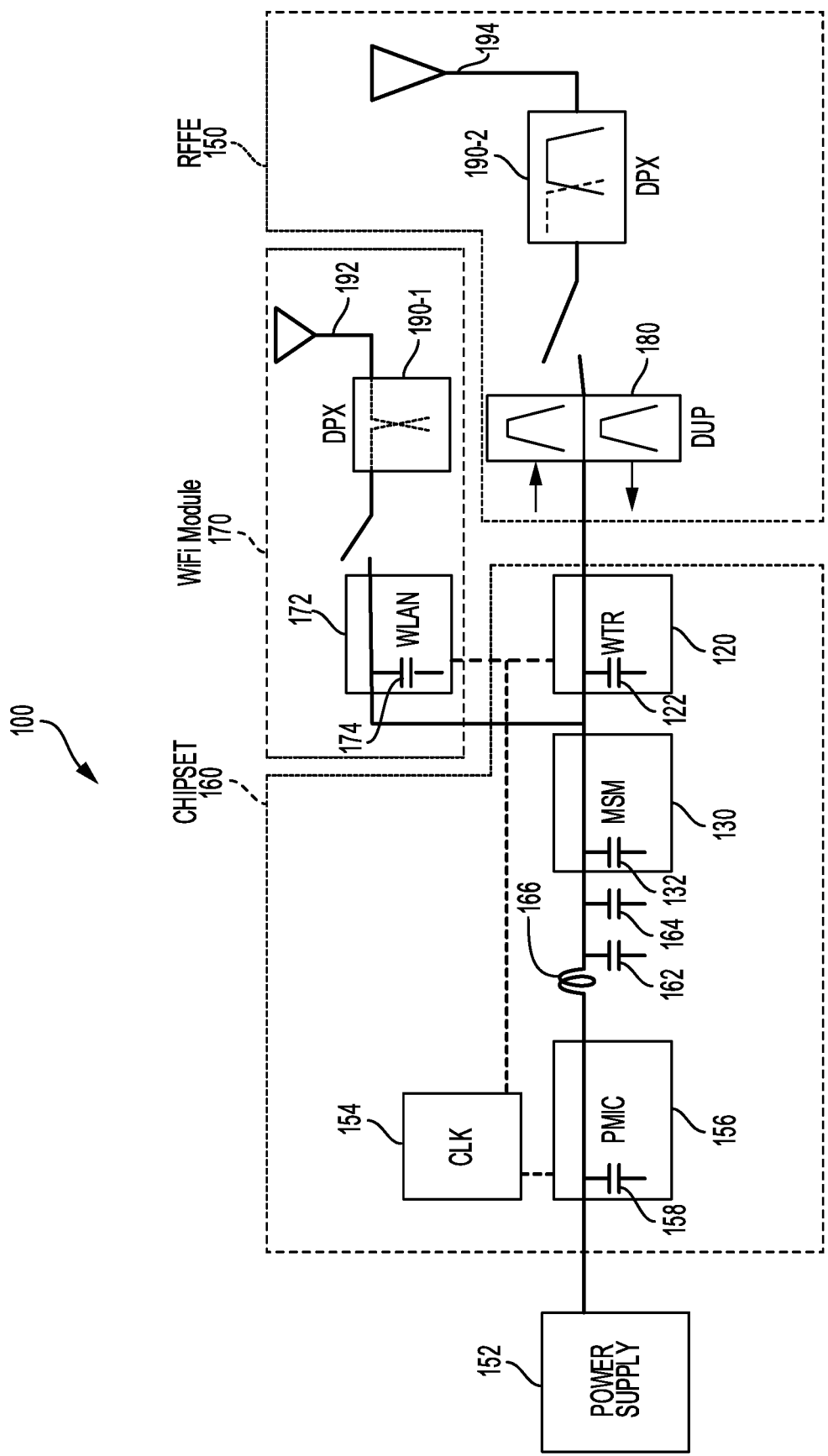
FIG. 1 is a diagram of a radio frequency (RF) communication system, in accordance with aspects of the disclosure.

The detailed description set forth below, in connection with the appended drawings, is intended as a description of various configurations and is not intended to represent the only configurations in which the concepts described in this document may be practiced. The detailed description includes specific details for the purpose of providing a thorough understanding of the various concepts. It will be apparent to those skilled in the art, however, that these concepts may be practiced without these specific details. In some instances, well-known structures and components are shown in block diagram form in order to avoid obscuring such concepts. As described in this document, the use of the term "and/or" is intended to represent an "inclusive OR," and the use of the term "or" is intended to represent an "exclusive OR."

Radio frequency (RF) chip designs often incorporate flip chips to connect semiconductor devices, such as integrated circuit (IC) chips and microelectromechanical systems (MEMS) to external circuitry with solder bumps deposited on solder pads. Flip chips may also be known as controlled collapse chip connections (C4). The solder pads are deposited on the chip pads on the top side of the laminate or package substrate during the final processing step. To mount the chip to external circuitry, the chip is flipped over, with the top side facing down and aligned with the matching pads on the external circuit. Solder reflow then forms the interconnections.

Flip chips couple to the external circuitry without using wires and electrical couplings are formed through the solder pads. To couple to other layers in the package substrate, through-silicon vias (TSVs) may be used. Through-silicon vias provide a vertical electrical coupling that passes completely through a silicon wafer or die. TSVs are high performance interconnects and can be used as alternatives to wire-bonding, allowing higher device densities with shorter interconnections.

Mobile radio frequency (RF) chip designs (e.g., mobile RF transceivers) have migrated to a deep sub-micron process node due to cost and power consumption considerations. The design complexity of mobile RF transceivers is further complicated by added circuit functions to support communication enhancements, such as 5G communications. Further design challenges for mobile RF transceivers include analog/RF performance considerations, including mismatch, noise, and other performance considerations. The design of these mobile RF transceivers includes the use of passive devices, for example, to suppress resonance and/or to perform filtering, bypassing, and coupling.

The passive devices include high-performance inductors that may be formed adjacent to dies, taking up the limited space available on the package substrate. Devices such as inductors may be implemented in conjunction with flip chips during the fabrication process. The dies used with flip chip dies may be opaque or transparent and may also have different thicknesses.

An inductor is an example of an electrical device used to temporarily store energy in a magnetic field within a wire coil according to an inductance value. This inductance value provides a measure of the ratio of voltage to the rate of change of current passing through the inductor. When the current flowing through an inductor changes, energy is temporarily stored in a magnetic field in the coil. In addition to their magnetic field storing capability, inductors are often used in alternating current (AC) electronic equipment, such as radio equipment. For example, the design of mobile RF transceivers includes the use of inductors with improved inductance density while reducing magnetic loss at high frequency (e.g., 500 megahertz (MHz) to 5 gigahertz (GHz) RF range).

Various aspects of the disclosure provide techniques for fabrication of a wire bond inductor assembly. The wire bond inductors of the disclosure may incorporate pad on the back side of the die and package pads on the package substrate coupled with a wire bond. The flip chip dies may be coupled die-to-flip chip package, die-to-die, or partially die-to-die as well as die-to-package substrate. Combining wire bond inductors provides for a tunable inductor. Further implementations with TSVs and flip chip package pads to form longer inductor loops are also described. A still further variant forms wire bonds with an adjacent flip chip or other die, such as a power amplifier. A plethora of pad shapes, including horizontal pads and curved pads are also available. Tunable pads may be created using a trimmable pad cut or trimmed by a laser. Curved die traces on the top side of the die may also be used to provide a wide range of inductances.

Some duplexers used in wireless devices may support as many as eight (8) frequency bands for simultaneous transmission and reception. These duplexers exhibit surface acoustic layer features that specify an increased filter size, which increases the size of the duplexers. Because of the acoustic characteristics, the mechanical structure of the duplexers is akin to a large capacitor. For example, the input and output of the duplexers are highly capacitive. Accordingly, inductors are used to reduce impedance of the duplexers to a desirable value. Multiple inductors are desirable within a small space to compensate for the high capacitance of the duplexers. The multiple inductors occupy an increased amount of space because a large area or volume is specified to generate magnetic wave or flux, which generates the inductance value. The space for the multiple inductors may be reduced using the wire bond inductors of the disclosure. Selecting appropriate inductor values is enhanced with tunable inductors that can be adapted to the needs of the duplexers and power amplifiers. The inductors may be used as a choke on a power amplifier or as a resonant trap, for example.

Aspects of the present disclosure are directed to reducing insertion loss and improving quality (Q)-factor while reducing the area for the inductors.

FIG. 1 is a schematic diagram of a radio frequency (RF) communications system 100 including an inductor structure integrated with a duplexer 180 according to an aspect of the present disclosure. Representatively, the RF communications system 100 includes a WiFi module 170 having a first diplexer 190-1 and an RF front-end module 150 including a second diplexer 190-2 for a chipset 160 to provide carrier aggregation according to an aspect of the present disclosure. The WiFi module 170 includes the first diplexer 190-1 communicably coupling an antenna 192 to a wireless local area network module (e.g., WLAN module 172). The RF front-end module 150 includes the second diplexer 190-2 communicably coupling an antenna 194 to a wireless transceiver (WTR) 120 through the duplexer 180. The wireless transceiver 120 and the WLAN module 172 of the WiFi module 170 are coupled to a modem (mobile station modem (MSM), e.g., baseband modem) 130 that is powered by a power supply 152 through a power management integrated circuit (PMIC) 156.

The chipset 160 also includes capacitors 162 and 164, as well as an inductor(s) 166 to provide signal integrity. The PMIC 156, the modem 130, the wireless transceiver 120, and the WLAN module 172 each include capacitors (e.g., 158, 132, 122, and 174) and operate according to a clock 154. The geometry and arrangement of the various inductor and capacitor components in the chipset 160 may reduce the electromagnetic coupling between the components. The RF communications system 100 may also include a power amplifier (PA) integrated with the duplexer 180 (e.g., a PAMID module). The duplexer 180 may filter the input/output signals according to a variety of different parameters, including frequency, insertion loss, rejection, or other like parameters. According to aspects of the present disclosure, the duplexer 180 may be integrated with an inductor structure.

Figure 2A:
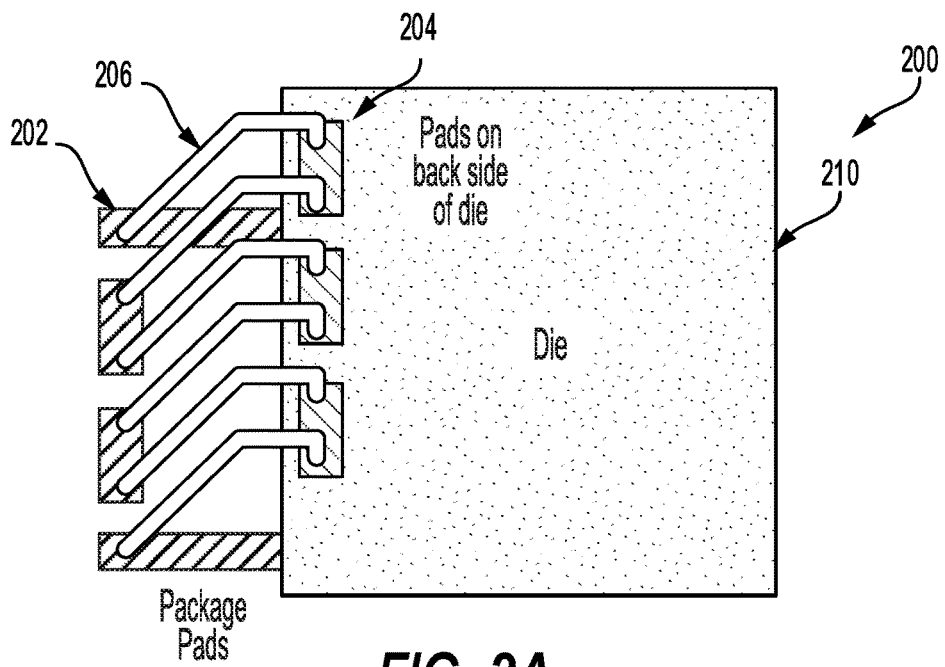
FIG. 2A shows top view of a wire bond inductor assembly for flip chip dies, in accordance with aspects of the disclosure.

FIG. 2A shows a top view of a wire bond inductor assembly 200 for flip chip dies, in accordance with aspects of the disclosure. The wire bond inductor assembly 200 includes a die 210 with an active layer that is opposite a back side surface of the die 210, with multiple backside pads 204 on the back side of the die 210. As shown in FIG. 2A, these backside pads 204 accommodate two of the wire bonds 206 within a pad on the back side of the die 210. The wire bonds 206 couple to package pads 202. Some of the package pads 202 couple to the active layer of the die 210. In flip chip devices, the back side of the die 210 faces up once the die 210 is "flipped" face down on the package pads 202. Some package pads 202 extend beneath the die 210 and form the electrical interconnections for die operation. The wire bond inductor assembly 200 coils or winds through the wire bonds 206 that are chained together by the backside pads 204 on the back side of the die 210 and the package pads 202 on the package substrate 212. The package pads 202 may couple the inductor to the active layer of the die 210.

The wire bond inductor assembly 200 is a passive device formed through the wire bonds 206, the backside pads 204 and the package pads 202. The number of the wire bonds 206 coupled through the backside pads 204 on the back side of the die 210 may be as needed to provide the specified inductance value for the wire bond inductor assembly 200. In some instances, more than two of the wire bonds 206 may be formed through the backside pads 204 on the back side, with the backside pads' rectangular shape extended to accommodate additional ones of the wire bonds 206.

Figure 2B:
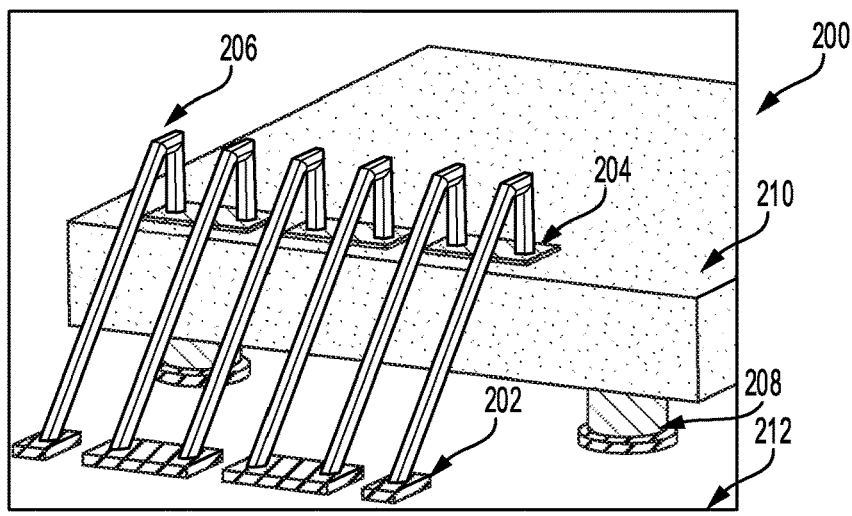
FIG. 2B shows a perspective view of the wire bond inductor assembly for flip chip dies of FIG. 2A, in accordance with aspects of the disclosure.

FIG. 2B shows a perspective view of the wire bond inductor assembly for flip chip dies of FIG. 2A, in accordance with aspects of the disclosure. The perspective view of the wire bond inductor assembly 200 also shows pillars 208 formed on the top side of the die 210. The pillars 208 route signals between the die 210 and a package substrate 212. The package substrate 212 also routes electrical signals between multiple components, including additional dies such as power amplifiers and multiplexers. Although not shown in FIG. 2B, the wire bond inductor assembly 200 may couple to the pillars 208 with package pads 202, enabling the die 210 to access the inductor.

Figure 2C:
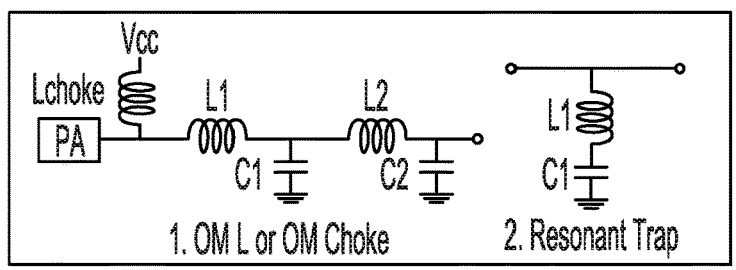
FIG. 2C shows a circuit diagram for two implementations of the wire bond inductor assembly of FIGS. 2A and 2B, in accordance with aspects of the disclosure.

FIG. 2C shows a circuit diagram for two implementations of the wire bond inductor assembly 200. One implementation of the wire bond inductor assembly 200 may be used as a choke inductor, as shown in the leftmost side of the circuit diagram of FIG. 2C. A choke inductor blocks higher frequency alternating current in an electrical circuit while passing direct current and lower frequencies of alternating current. In effect, the high frequencies are "choked" off, thus decoupling the higher frequencies. In conventional systems, a choke is a coil of insulated wire wound on a magnetic core. Some choke inductors may be spiral inductors or co-spiral inductors.

A further implementation uses the wire bond inductor assembly 200 to trap resonant high frequencies. The wire bond inductor assembly 200 also acts to block high frequencies. The amount of inductance is selected to trap particular frequencies. The rightmost side of the circuit diagram of FIG. 2C illustrates the resonant trap implementation.

Figure 3:
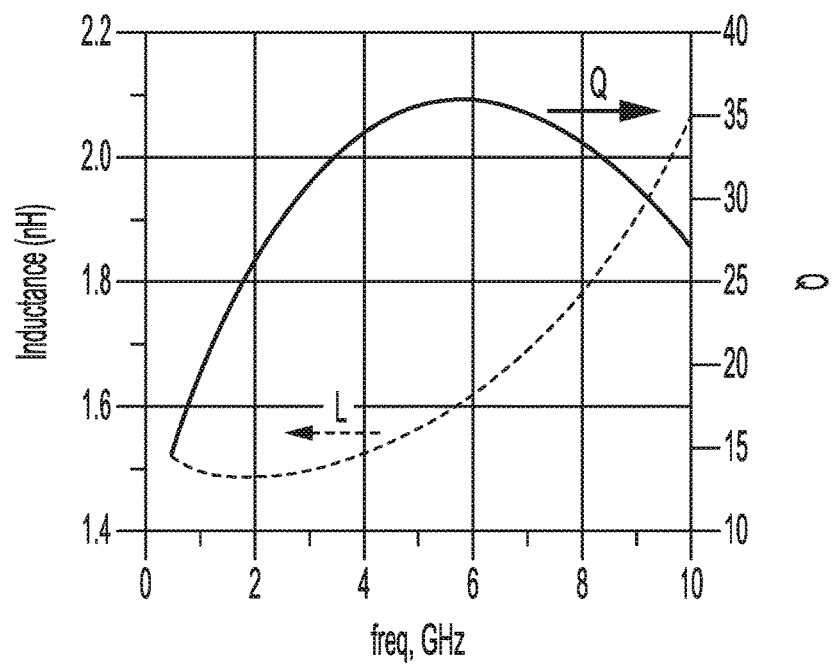
FIG. 3 is a graph illustrating the relationship between inductance and quality (Q)-factor over a range of frequencies, in accordance with aspects of the disclosure.

FIG. 3 is a graph illustrating the relationship between inductance and quality (Q) over a range of frequencies, in accordance with aspects of the disclosure. The graph shows the relationship between inductance, frequency, and Q-factor values. Q-factor is a dimensionless parameter that describes the resonance behavior of an underdamped harmonic oscillator. Sinusoidally driven resonators having higher Q-factors resonate with greater amplitudes at the resonant frequency, but have a smaller bandwidth. A high Q-factor circuit in a receiver is more difficult to tune, but better filters out signals from nearby devices operating on frequencies near those of the receiver. Alternatively, Q-factor can also be defined as the ratio of a resonator's center frequency to its bandwidth when subject to an oscillating driving force. A higher Q-factor indicates a lower rate of energy loss. FIG. 3 shows a non-limiting example of the performance of the wire bond inductors of the disclosure which provide high Q-factor RF inductors, with a maximum Q-factor of 35 at approximately 6 GHz and an inductance of approximately 2.1 nH.

Figure 4:
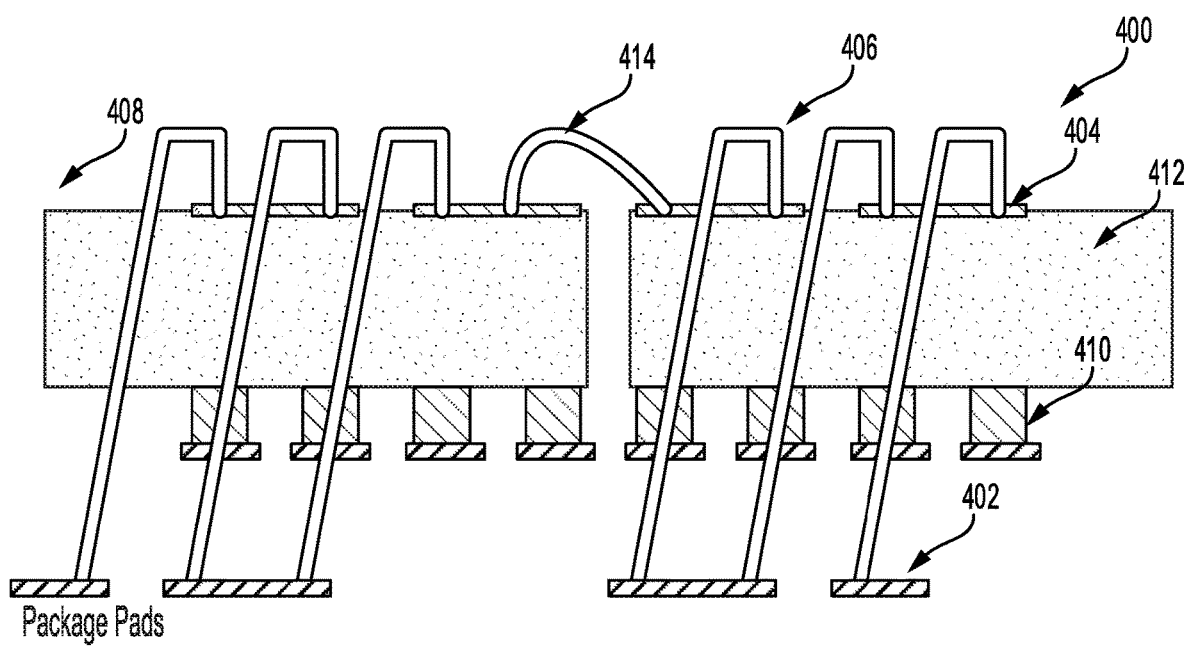
FIG. 4 shows a side view of a wire bond inductor for flip chip dies with tunable inductance, in accordance with aspects of the disclosure.

FIG. 4 shows a side view of a wire bond inductor for flip chip dies with tunable inductance, in accordance with aspects of the disclosure. FIG. 4 shows a side view of a wire bond inductor assembly 400. The wire bond inductor assembly 400 includes a die 408 with backside pads 404 on the back side of the die 408. As shown in FIG. 4, each backside pad 404 can accommodate two wire bonds 406 within a pad on the back side of the die 408. The wire bonds 406 couple to package pads 402, and as shown in FIG. 4, may also couple to an adjacent die 412 through a die-to-die interconnect 414 (e.g., die-to-die). The die-to-die interconnect 414 creates a tunable wire bond inductor. While FIG. 4 shows the die-to-die interconnect 414 connecting die 408 and adjacent die 412 the backside pads 404 may also be used to form on-die interconnections, allowing tunable inductance on a single die. The inductance value may be changed by selecting a mix of die-to-die interconnects 414 and wire bonds 406. Moreover, the die-to-die interconnect 414 may skip over a backside pad, further adjusting the inductance value. FIG. 4 shows a mix of wire bonds 406 with a die-to-die interconnect 414 in between the wire bond 406 groups. Die-to-die interconnect 414 connects die 408 to die 412. If a different value wire bond inductor is desired, die-to-die interconnect 414 may be replaced with wire bonds 406 coupling to selected backside pads 404. In addition, the number of die-to-die interconnects 414 and wire bonds provides tunability to a desired inductance value. The inductance value of the wire bond inductor may be varied through the selection of pads selected for coupling. The pillars 410 do not affect the inductance value of wire bond inductor assembly 400. In flip chip devices, the back side of the dies 408 and 412 face up once the dies 408 and 412 are "flipped" face down on the package pads 402. Once the dies 408 and 412 have been flipped, the die-to-die interconnect 414 appears when the die is viewed from above.

Although not shown in FIG. 4, the package pads 402 may extend beneath the dies 408 and 412 and form electrical interconnections for device operation. The wire bond inductor assembly 400 coils or winds through the wire bonds 406 chained together by the backside pads 404 on the back side of the dies 408 and 412 and the package pads 402. The wire bond inductor assembly 400 also extends along the back side of both dies 408, 412 through the die-to-die interconnect 414. The inductor is a passive device formed by the wire bonds 406 wound through the backside pads 404, the die-to-die interconnect 414, and the package pads 402.

A number of wire bonds 406 coupled through the backside pads 404 on the back side of dies 408 and 412 may be selected as needed to provide the specified inductance value for the wire bond inductor assembly 400. In some instances, more than two of the wire bonds 406 may be coupled together with the backside pads 404 on the back side, with the backside pads 404 extended to allow additional ones of the wire bonds 406. Similarly, the die-to-die interconnect 414 may couple more dies than shown in FIG. 4. The wire bond inductor assembly 400 provides a tunable inductor through the die-to-die interconnect 414, expanding the selection of inductors.

Figure 5:
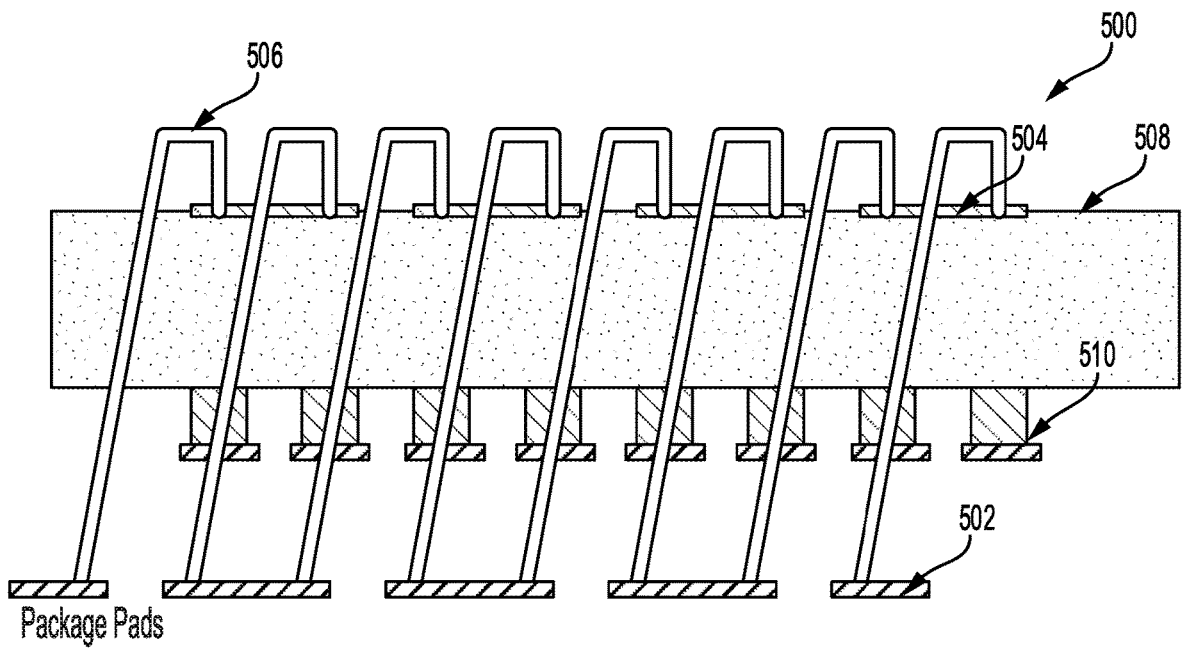
FIG. 5 shows a side view of a die-to-package variation of a wire bond inductor for flip chip dies, in accordance with aspects of the disclosure.

FIG. 5 shows a side view of a die-to-package variation of a wire bond inductor for flip chip dies, in accordance with aspects of the disclosure. FIG. 5 shows a side view of a wire bond inductor assembly 500 using die-to-package wire bonds 506. The wire bond inductor assembly 500 includes a die 508 with backside pads 504 on the back side of the die 508. As shown in FIG. 5 each backside pad 504 can accommodate two wire bonds 506 within a pad on the back side of the die 508. The wire bonds 506 couple to package pads 502. In flip chip devices, the back side of the die 508 faces up once the die 508 is "flipped" face down on the package pads 502. Although not shown in FIG. 5, the package pads 502 may extend beneath the die 508 and form electrical interconnections for die operation. The wire bond inductor assembly 500 coils through the wire bonds 506 that are chained together by the backside pads 504 on the back side of the die 508 and the package pads 502. The number of the wire bonds 506 coupled through the backside pads 504 on the back side of the die 508 may be selected to provide the specified inductance value for the wire bond inductor assembly 500. In some instances, more than two of the wire bonds 506 may couple through the backside pads 504 on the back side, with the backside pads' shape extended to allow additional ones of the wire bonds 506. The pillars 510 support the die 508 and may not affect the inductance of the wire bond inductor assembly 500.

Figure 6:
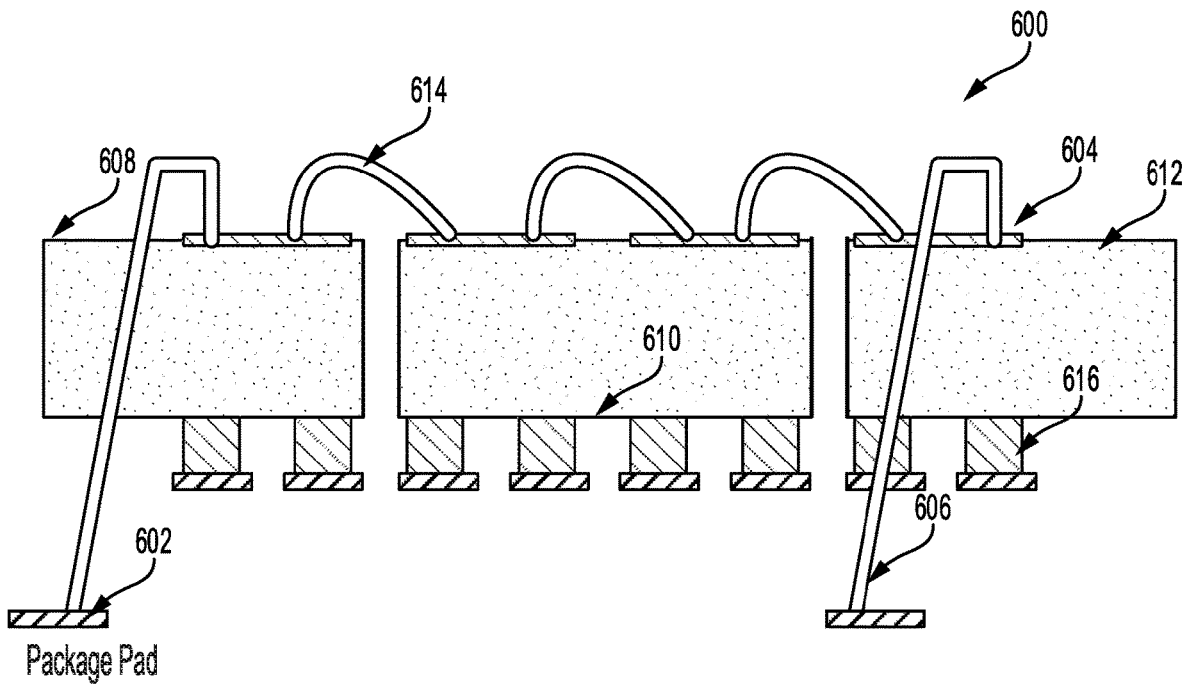
FIG. 6 shows a side view of a die-to-die variation of a wire bond inductor for flip chip dies, in accordance with aspects of the disclosure.

FIG. 6 shows a side view of a die-to-die variation of a wire bond inductor for flip chip dies, in accordance with aspects of the disclosure. FIG. 6 shows a side view of a wire bond inductor assembly 600 with multiple die-to-die interconnects 614. The wire bond inductor assembly 600 includes multiple dies with a first die 608, a second die 610, and a third die 612 with backside pads 604 on the back side of each of the first die 608, second die 610, and third die 612. The wire bond inductor assembly 600 includes die-to-die interconnects 614 along the back side of the dies 608, 610, and 612. While FIG. 6 shows the die-to-die interconnect 614 connecting dies 608, 610, and 612 the backside pads 604, may also be used to form on-die interconnections, allowing tunable inductance on a single die. Wire bonds 606 couple to package pads 602 and the backside pads 604. In flip chip devices, the back side of the first die 608, second die 610, and third 612 face up once the first die 608, second die 610, and third die 612 are "flipped" face down on the package pads 602. The package pads 602 may extend beneath each of the first die 608, second die 610, and third die 612 and form electrical interconnections for die operation, although not shown in FIG. 6. The wire bond inductor assembly 600 coils through the wire bonds 606 chained together by the backside pads 604 on the back side of the first die 608, second die 610, and third die 612. The wire bond inductor assembly 600 continues the coil structure through the die-to-die interconnects 614 before returning to the package pads 602. The number of wire bonds 606 coupled through the backside pads 604 on the back side of the first die 608 and the second die 610 may be as needed to provide the specified inductance value for the wire bond inductor assembly 600. In some instances, more than two of the wire bonds 606 may be formed through the backside pads 604 on the back side.

Figure 7:
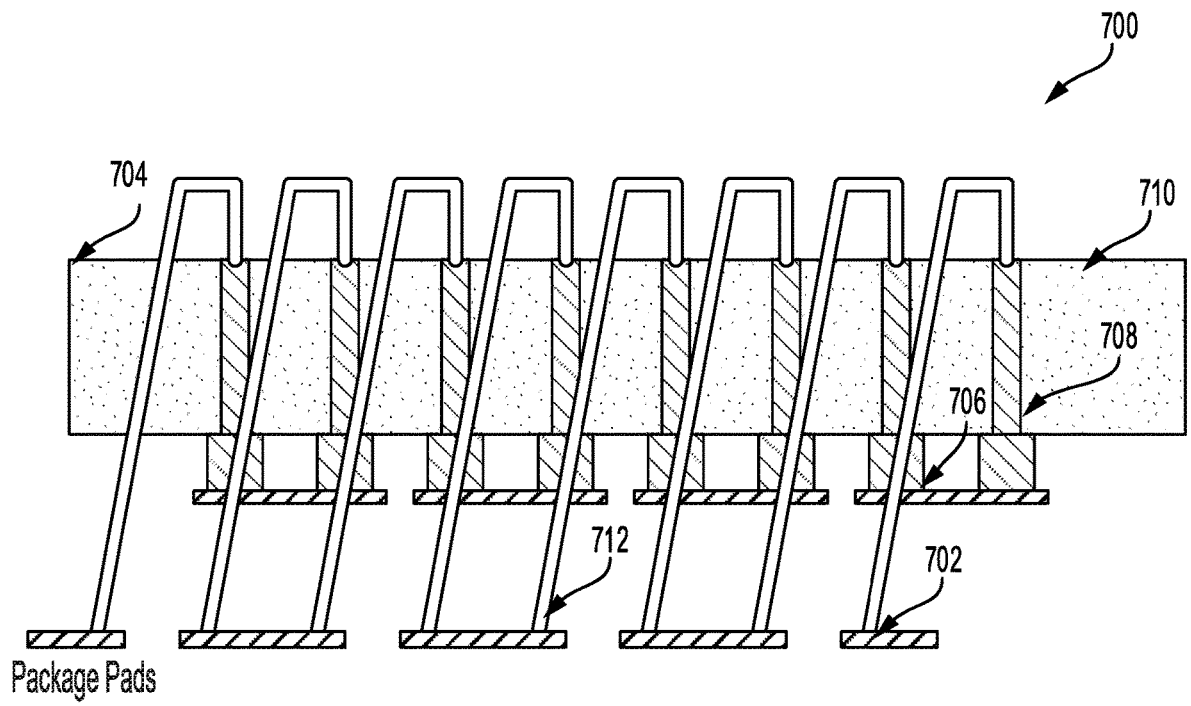
FIG. 7 shows a side view of a further variation of a wire bond inductor incorporating through silicon vias (TSVs), in accordance with aspects of the disclosure.

FIG. 7 shows a side view a further variation of a wire bond inductor incorporating through silicon vias (TSVs), in accordance with aspects of the disclosure. FIG. 7 shows a side view of a wire bond inductor assembly 700. The wire bond inductor assembly 700 includes a die 710 with TSVs 708 accessible on the front side and back side of the die 710. As shown in FIG. 7, these TSVs 708 are coupled in pairs through TSV pads 706 on the front side of the die 710. Wire bonds 712 couple the package pads 702 to a back side 704 of the die 710, enabling current to pass through the die 710, in a TSV 708 to a TSV pad 706. The TSV pad 706 continues the coil structure to the next TSV 708 and to the back side 704 of the die 710, to another wire bond 712 and to a package pad 702 coupling to a next wire bond 712. The package pads 702 may extend beneath the die 710 and with the TSVs 708, form electrical interconnections for die operation. The wire bond inductor assembly 700 thus coils through the wire bonds 712 that are chained together by the TSVs 708 coupled by TSV pads 706 and the package pads 702. The number of wire bonds 712 connected through the TSV pads 706 and the TSVs 708 on the back side of the die 710 may be as needed to provide the specified inductance value for the assembly 700. Although FIG. 7 shows package pads 702, they are considered to be optional. That is, the wire bond inductor assembly 700 may include TSVs 708, TSV pads 706 and wire bonds coupling between TSVs 708 on the back side of the die 710.

Figure 8:
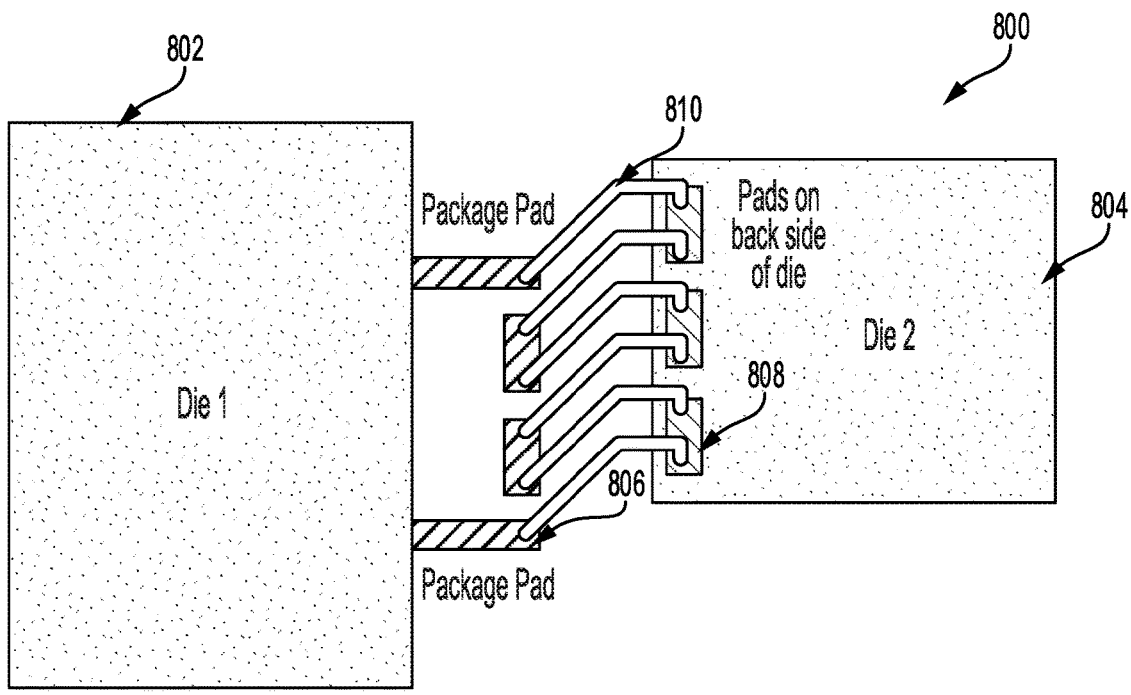
FIG. 8 shows a top view of a further variation of a wire bond inductor incorporating die-to-adjacent die interconnections, in accordance with aspects of the disclosure.

FIG. 8 shows a top view of a further variation of a wire bond inductor incorporating die-to-adjacent die interconnections, in accordance with aspects of the disclosure. In FIG. 8, a wire bond inductor assembly 800 is formed by chaining coils between a first die 802 and a second die 804. The first die 802 may be a power amplifier and the second die 804 may be a switch or filter, for example. Other devices may also be selected for the first die 802 and the second die 804. The first die 802 couples to package pads 806 that couple to wire bond interconnects 810. The wire bond interconnects 810 couple to backside pads 808 on the back side of the second die 804. The coil structure of the wire bond inductor assembly 800 thus extends between the first die 802 and the second die 804. The package pads 806 may be rectangular shaped and may provide coupling for two of the wire bond interconnects 810, for example.

Figure 9:
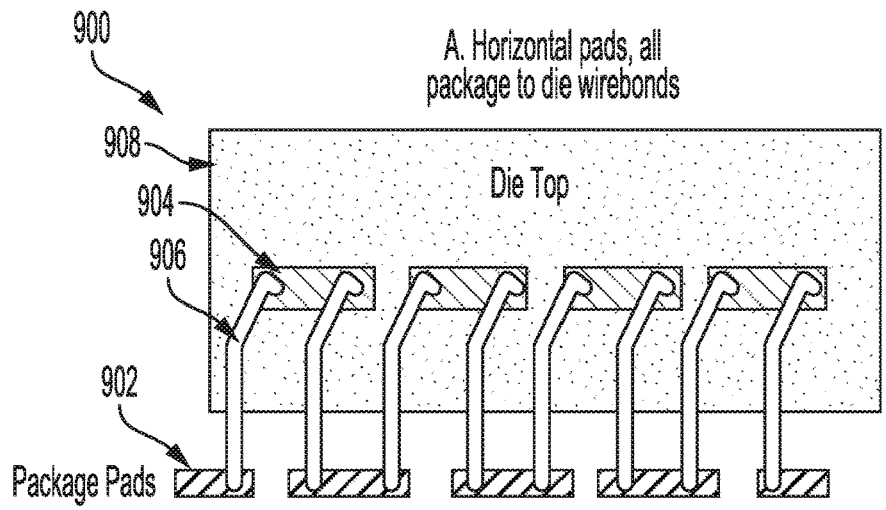
FIG. 9 shows a top view of a further variation of a wire bond inductor with package-to-die wire bonds, in accordance with aspects of the disclosure.

FIG. 9 shows a top view of a further variation of a wire bond inductor with package-to-die wire bonds, in accordance with aspects of the disclosure. FIG. 9 shows a top view of a wire bond inductor assembly 900. A die top 908 has backside pads 904 that may be rectangular in shape and may allow for two package-to-die wire bonds 906 for each die of the backside pads 904. The package-to-die wire bonds 906 couple to package pads 902. FIG. 9 illustrates how the coil of the wire bond inductor assembly 900 is formed with the backside pads 904 allowing spacing of the package-to-die wire bonds 906. In this example, the wire bond inductor assembly 900 is formed using package-to-die wire bonds 906 across a single die.

Figure 10:
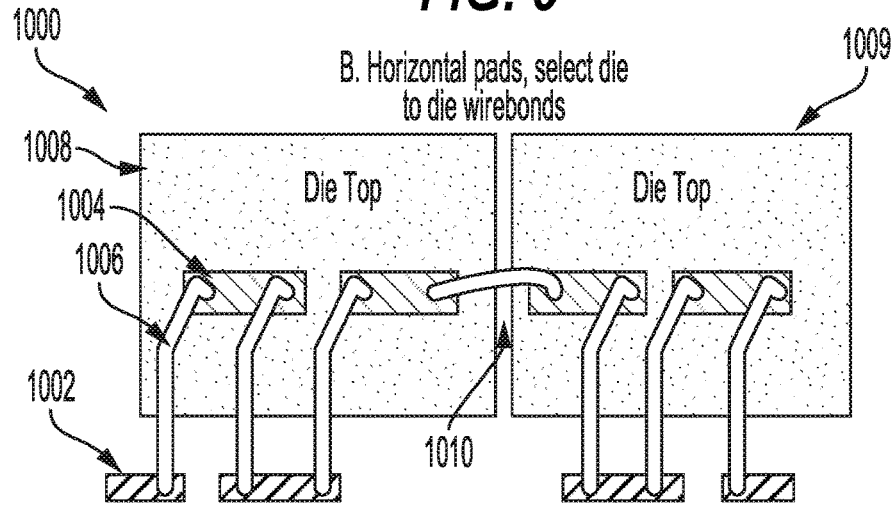
FIG. 10 shows a top view of a further variation of a wire bond inductor with select die-to-die wire bonds, in accordance with aspects of the disclosure.

FIG. 10 shows a top view of a further variation of a wire bond inductor with die-to-die wire bonds, in accordance with aspects of the disclosure. FIG. 10 shows a top view of a wire bond inductor assembly 1000 using package pads 1002, backside pads 1004, package-to-die wire bonds 1006, and die-to-die wire bonds 1010. Each backside pad 1004 on the first die top 1008 may accommodate two of the package-to-die wire bonds 1006, or a package-to-die wire bond 1006 and a die-to-die wire bond 1010. Similarly, each backside pad 1004 on the second die top 1009 may accommodate two of the package-to-die wire bonds 1006, or a package-to-die wire bond 1006 and a die-to-die wire bond 1010. While FIG. 10 shows the die-to-die interconnect 1010 connecting the first die top 1008 and the second die top 1009, the backside pads 1004 may also be used to form on-die interconnections, allowing tunable inductance on a single die. The backside pads 1004 may be directly chained to another of the backside pads 1004 through one of the die-to-die wire bonds 1010. The package-to-die wire bonds 1006 couple to the package pads 1002. FIG. 10 illustrates how the coil of the wire bond inductor assembly 1000 is formed with the backside pads 1004 allowing for spacing of the package-to-die wire bonds 1006. The wire bond inductor assembly 1000 is formed using die-to-die wire bonds 1010, the backside pads 1004, the package-to-die wire bonds 1006 and the package pads 1002. The wire bond inductor assembly 1000 thus coils through the package-to-die wire bonds 1006 and couples across the die top 1008 using the die-to-die wire bonds 1010 and backside pads 1004 and then returns to a coil formed through the backside pads 1004 coupled to the package pads 1002 through the package-to-die wire bonds 1006.

Figure 11:
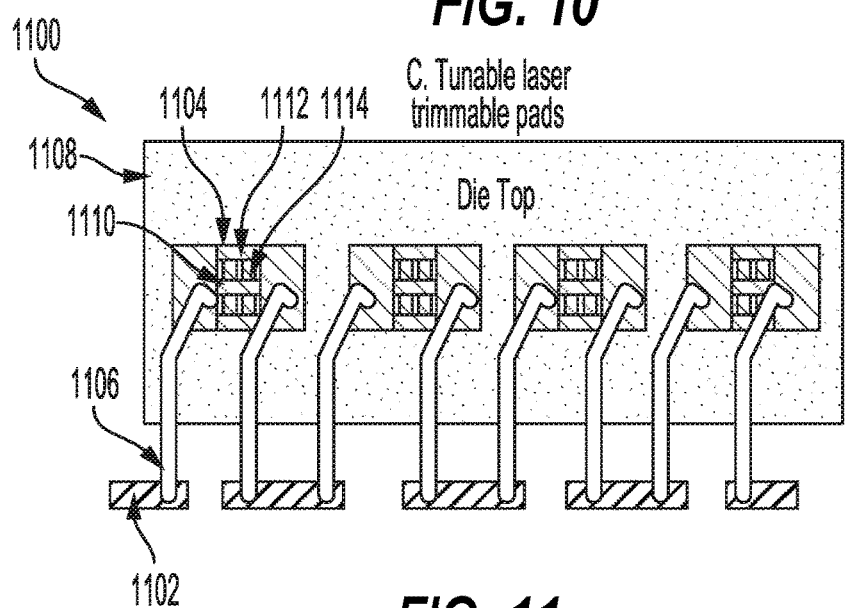
FIG. 11 shows a top view of a further variation of a wire bond inductor with tunable laser trimmed pads, in accordance with aspects of the disclosure.

FIG. 11 shows a top view of a further variation of a wire bond inductor with tunable laser trimmed pads, in accordance with aspects of the disclosure. In this variation, a wire bond inductor assembly 1100 provides a tunable inductor through the use of laser trimmable pads 1104. The laser trimmable pads 1104 include a metal grid having both vertical bars 1110 and horizontal bars 1112 with a grid pattern of openings 1114. The vertical bars 1110 and the horizontal bars 1112 are metal and create an intermediate path when selected vertical bars 1110 and horizontal bars 1112 are trimmed. Laser trimming selectively disconnects paths within the laser trimmable pads 1104, enabling tuning of the wire bond inductor assembly 1100. For example, trimming two of the horizontal bars 110 would decrease current flow between adjacent wire bonds 1106. The wire bond inductor assembly 1100 uses the wire bonds 1106 to wind across a die top 1108 through the laser trimmable pads 1104, and to the package pads 1102.

Figure 12:
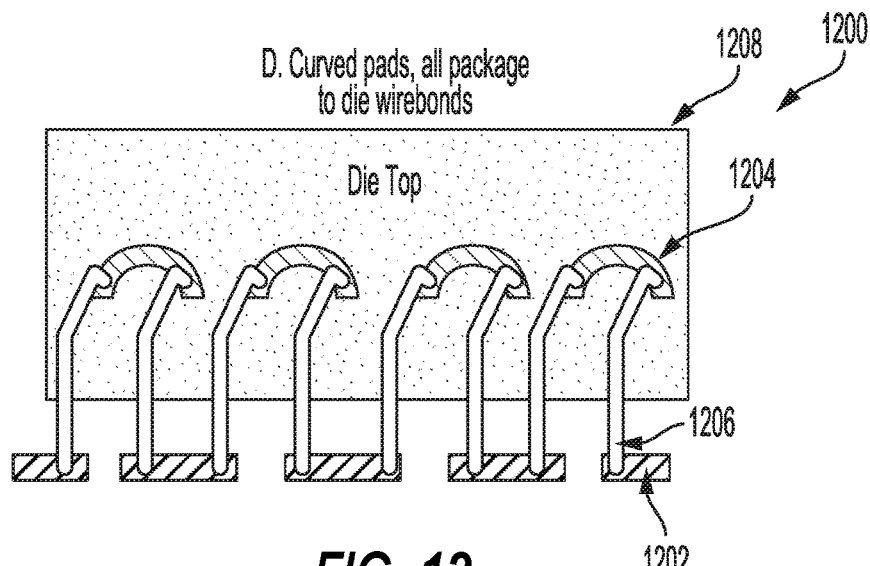
FIG. 12 shows a top view of a further variation of a wire bond inductor with curved pads, in accordance with aspects of the disclosure.

FIG. 12 shows a top view of a further variation of a wire bond inductor with curved pads, in accordance with aspects of the disclosure. FIG. 12 shows a top view of a wire bond inductor assembly 1200. A die top 1208 has curved backside pads 1204, similar to a banana in shape, for example, and providing space for two wire bonds 1206. The shape of the curved backside pads 1204 may be modified as needed to meet electrical specifications and space considerations. The wire bonds 1206 couple to package pads 1202 and the wire bonds 1206 shown in FIG. 12 are package-to-die couplings. The die top 1208 illustrates how the coil of the wire bond inductor assembly 1200 is formed with the curved backside pads 1204 allowing spacing of the wire bonds 1206 with the coupling to the package pads 1202. The wire bond inductor assembly 1200 includes the wire bonds 1206 (e.g., package-to-die wire bonds) and curved backside pads 1204 across the die top 1208.

Figure 13:
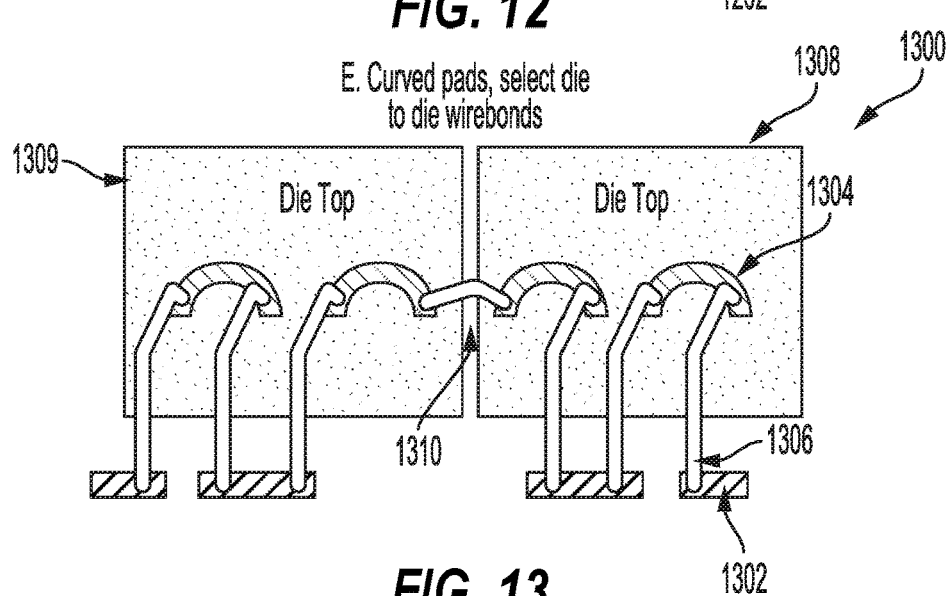
FIG. 13 shows a top view of a further variation of a wire bond inductor with curved pads and select die-to-die wire bonds, in accordance with aspects of the disclosure.

FIG. 13 shows a top view of a further variation of a wire bond inductor with curved pads and select die-to-die wire bonds, in accordance with aspects of the disclosure. FIG. 13 shows a top view of a wire bond inductor assembly 1300. A die top 1308 has curved backside pads 1304, allowing coupling of wire bonds. The curved shape shown may be modified as needed to meet electrical specifications and space considerations. Package-to-die wire bonds 1306 couple between package pads 1302 and the curved backside pads 1304. A die-to-die wire bond 1310 is also located between the first die top 1308 and the second die top 1309 coupling together the curved backside pads 1304. While FIG. 13 shows the die-to-die wire bond 1310 connecting the first die top 1308 and the second die top 1309, the curved backside pads 1304 may also be used to form on-die interconnections, allowing tunable inductance on a single die. A number of curved backside pads 1304 may vary based on design specifications. FIG. 13 illustrates how the coil of the wire bond inductor assembly 1300 is formed with the curved backside pads 1304 allowing for spacing of the package-to-die wire bonds 1306 coupling to the package pads 1302.

Figure 14:
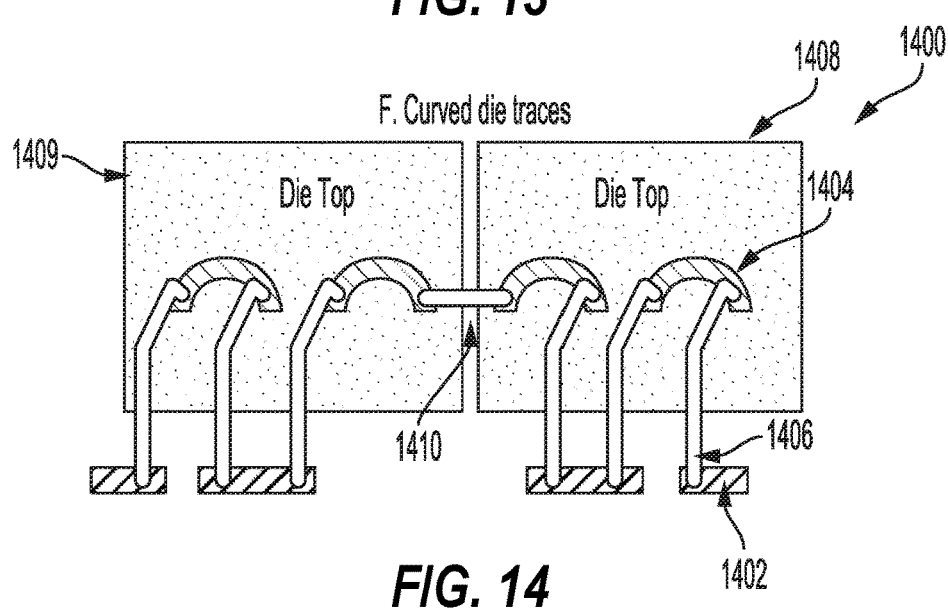
FIG. 14 shows a top view of a further variation of a wire bond inductor with curved pads, in accordance with aspects of the disclosure.

FIG. 14 shows a top view of a further variation of a wire bond inductor with curved pads, in accordance with aspects of the disclosure. FIG. 14 shows a top view of a wire bond inductor assembly 1400. FIG. 14 shows a first die top 1408 with curved backside pads 1404. Each of the curved backside pads 1404 supports two wire bonds 1406 in the example shown in FIG. 14. The wire bond inductor assembly 1400 also shows a second die top 1409 with curved backside pads 1404, each supporting two wire bonds 1406. The curved shape shown may be modified as needed to meet electrical specifications and space considerations. A curved die trace 1410 is an example of a modified curved shape that forms a longer trace on the first die top 1408 and couples to the second die top 1409. While FIG. 14 shows the curved die trace 1410 connecting the first die top 1408 and the second die top 1409, the curved backside pads 1404 may also be used to form on-die interconnections, allowing tunable inductance on a single die. The wire bonds 1406 couple to package pads 1402, package pads, and to each end of the curved die trace 1410. FIG. 14 illustrates how the coil of the wire bond inductor assembly 1400 is formed with the curved backside pads 1404 and the curved die trace 1410 that crosses from the first die top 1408 to the second die top 1409, allowing for spacing of the wire bonds 1406 with couplings to the package pads 1402. The wire bond inductor assembly 1400 is formed using the wire bonds 1406 (e.g., package-to-die wire bonds), the package pads 1402, the curved backside pads 1404, and the curved trace 1410 that crosses one or more dies, as shown by the first die top 1408 and the second die top 1409.

Figure 15A:
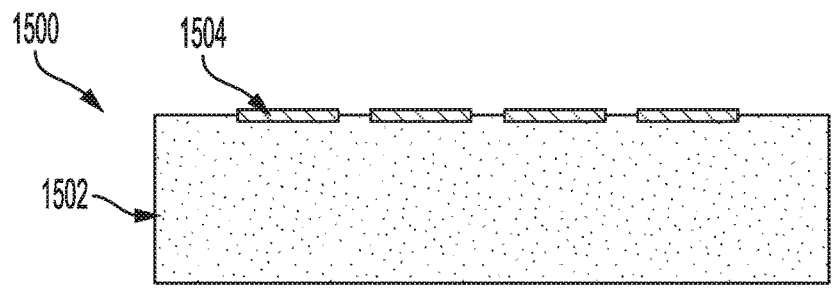
FIGS. 15A-15D show side views of a process of forming a wire bond inductor on a flip chip, in accordance with aspects of the disclosure.

FIGS. 15A-15D show side views illustrating a process of forming a wire bond inductor on a flip chip, in accordance with aspects of the disclosure. The manufacturing process produces a wire bond inductor assembly 1500. Before forming the wire bond inductor assembly 1500, integrated circuits or dies 1502 are created from a wafer. Backside pads 1504 are then metallized on the surface of the dies 1502. FIG. 15A shows a single die 1502 with backside pads 1504 formed by metallization on the back side of the die 1502. A solder dot (not shown) is deposited on each of the backside pads 1504.

Figure 15B:
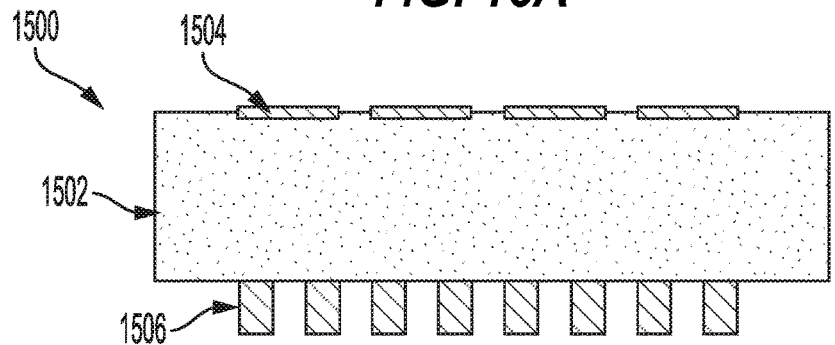

In FIG. 15B, front side bumps/pillars 1506 are formed on the front side of the die 1502, opposite to the backside pads 1504. The dies 1502 are then separated or singulated from the wafer (not shown). The front side bumps/pillars 1506 are in contact with package pads 1508 (shown in FIG. 15C) on the package substrate when the flip chip is "flipped" as part of the manufacturing process. The flip chips are positioned so that the front side bumps/pillars 1506 face the package pads 1508.

Figure 15C:
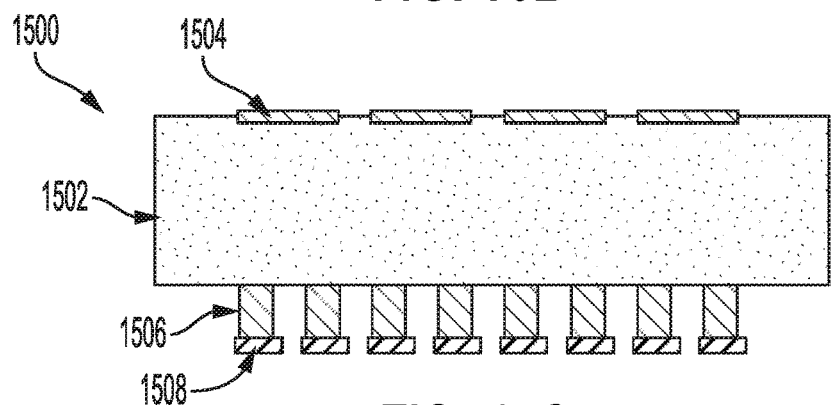
Figure 15D:
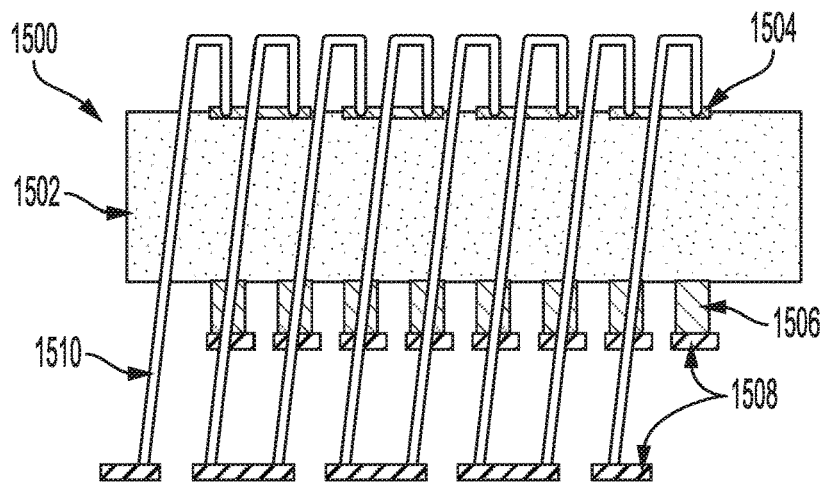

FIG. 15C shows the die 1502 after "flipping" but prior to soldering. At this point in the manufacturing process, the solder dot is reflowed to form couplings with the package pads 1508 and the front side bumps/pillars 1506. Once the die 1502 has been soldered in place on the package pads 1508, wire bonds 1510 that form the inductor are installed to couple the backside pads 1504 with the front side bumps/pillars 1506 and the package pads 1508 to form the wire bond inductor assembly 1500, as shown in FIG. 15D.

Figure 16:
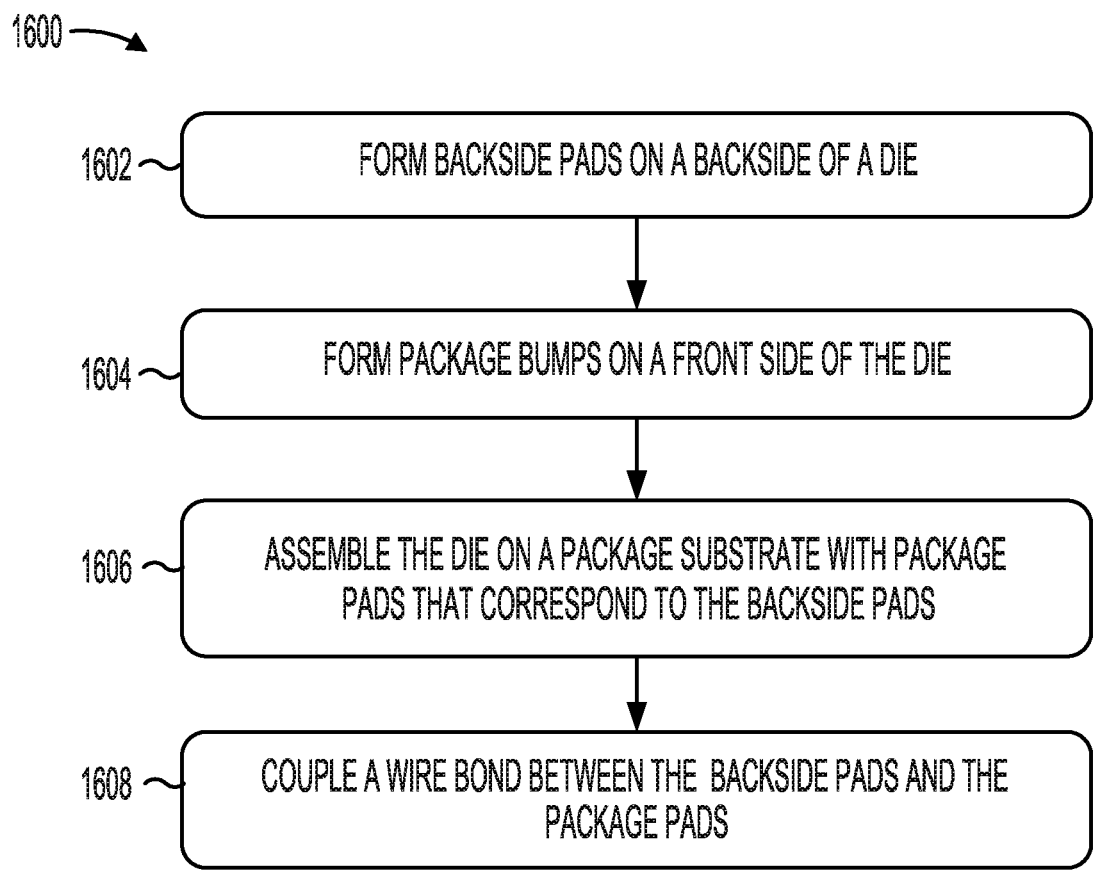
FIG. 16 is a flow chart of a method of forming a wire bond inductor on a flip chip, in accordance with aspects of the disclosure.

FIG. 16 is a flowchart of a method 1600 of forming a wire bond inductor on a flip chip, in accordance with aspects of the disclosure. The method 1600 begins in block 1602, with a process to form backside pads on a back side of a die. As shown in FIG. 15A, before forming the wire bond inductor assembly 1500, integrated circuits or dies 1502 are created on a wafer. In block 1604, the method 1600 continues with a further process to form package bumps on a front side of the die. As shown in FIG. 15A, pads are then metallized on the surface of the dies 1502. FIG. 15A shows a die 1502 with backside pads 1504 formed by metallization on the back side of the die 1502.

In block 1606, the next process is to assemble the die on a package substrate with package pads that correspond to the backside pads. As shown in FIG. 15B, the flip chips are then "flipped" and positioned so that the front side bumps/pillars 1506 face the package pads 1508. In block 1608, the process continues with coupling a wire bond through the backside pads and the package pads. Once the die 1502 has been soldered in place on the package pads 1508 the wire bonds 1510 that form the inductor are installed to couple the backside pads 1504 with the front side bumps/pillars 1506 and the package pads 1508 to form the wire bond inductor assembly 1500, as shown in FIG. 15D.

Figure 17:
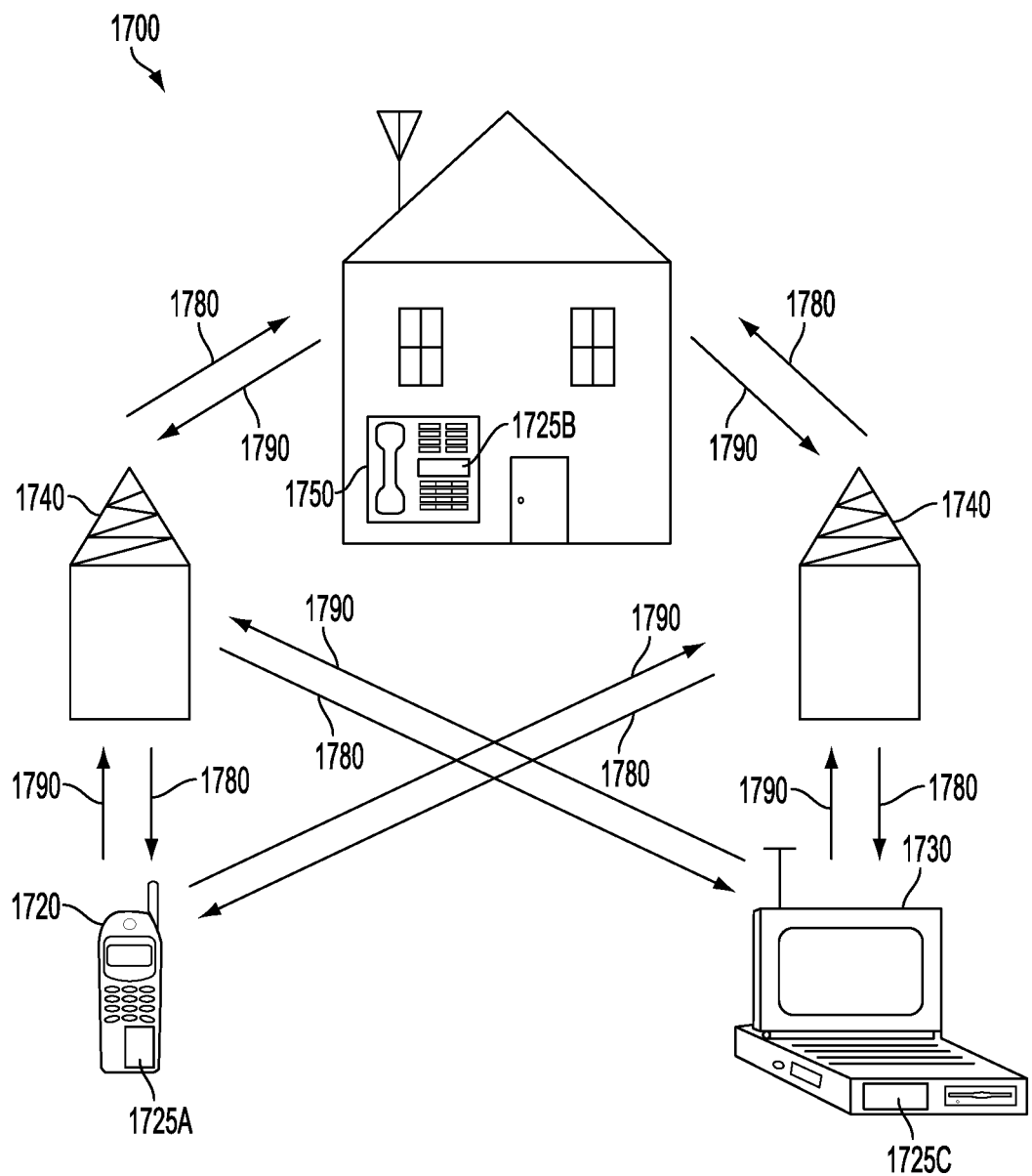
FIG. 17 is a block diagram showing an exemplary wireless communication system in which a configuration of the disclosure may be advantageously employed.

FIG. 17 is a block diagram showing an exemplary wireless communication system 1700 in which an aspect of the disclosure may be advantageously employed. For purposes of illustration, FIG. 17 shows three of the remote units 1720, 1730, and 1750 and two of the base stations 1740. It will be recognized that wireless communication systems may have many more remote units and base stations. Remote units 1720, 1730, and 1750 each include IC devices 1725A, 1725C, and 1725B having a radio frequency (RF) front-end module that includes the disclosed wire bond inductor. It will be recognized that other devices may also include the disclosed wire bond inductor, such as the base stations, switching devices, and network equipment including a RF front-end module. FIG. 17 shows forward link signals 1780 from one of the base stations 1740 to the remote units 1720, 1730, and 1750 and reverse link signals 1790 from the remote units 1720, 1730, and 1750 to base stations 1740.

In FIG. 17, one of the remote units 1720 is shown as a mobile telephone, one of the remote units 1730 is shown as a portable computer, and remote unit 1750 is shown as a fixed location remote unit in a wireless local loop system. For example, the remote units 1720, 1730, and 1750 may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or a communications device, including an RF front-end module, that stores or retrieves data or computer instructions, or combinations thereof. Although FIG. 17 illustrates remote units according to the aspects of the disclosure, the disclosure is not limited to these exemplary illustrated units. Aspects of the disclosure may be suitably employed in many devices, which include the disclosed wire bond inductor.

Figure 18:
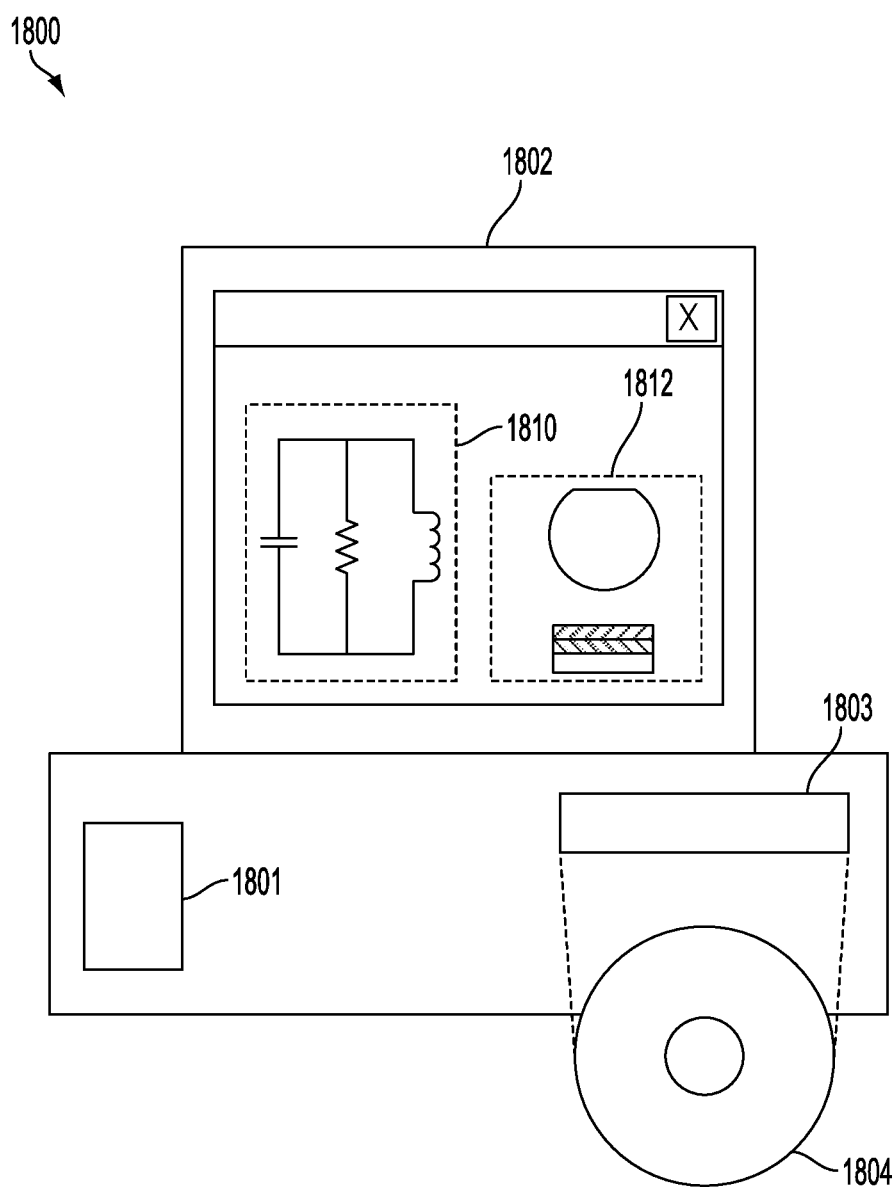
FIG. 18 is a block diagram illustrating a design workstation used for circuit, layout, and logic design of the wire bond inductor structures for flip chip dies according to aspects of the present disclosure.

FIG. 18 is a block diagram illustrating a design workstation used for circuit, layout, and logic design of the wire bond inductor disclosed above. A design workstation 1800 includes a hard disk 1801 containing operating system software, support files, and design software such as Cadence or OrCAD. The design workstation 1800 also includes a display 1802 to facilitate design of a circuit 1810 or a wire bond inductor assembly. A storage medium 1804 is provided for tangibly storing the design of the circuit 1710 or the wire bond inductor. The design of the circuit 1810 or the wire bond inductor may be stored on the storage medium 1804 in a file format such as GDSII or GERBER. The storage medium 1804 may be a CD-ROM, DVD, hard disk, flash memory, or other appropriate device. Furthermore, the design workstation 1800 includes a drive apparatus 1803 for accepting input from or writing output to the storage medium 1804.

Data recorded on the storage medium 1804 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1804 facilitates the design of the circuit 1810 or the wire bond inductor assembly by decreasing the number of processes for designing semiconductor or passive components.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD) and Blu-ray disc where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods, and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with this disclosure may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with this disclosure may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described in this document. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used in this document, includes compact disc (CD), laser disc, optical disc, digital versatile disc (DVD) and Blu-ray disc where disks usually reproduce data magnetically, while discs reproduce data optically with lasers. Combinations of the above should also be included within the scope of computer-readable media.

The previous description is provided to enable any person skilled in the art to practice the various aspects described in this document. Various modifications to these aspects will be readily apparent to those skilled in the art, and the generic principles defined in this document may be applied to other aspects. Thus, the claims are not intended to be limited to the aspects shown in this document, but is to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated in this document by reference and are intended to be encompassed by the claims. Moreover, nothing disclosed in this document is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "a step for."

What is claimed is:

1. An integrated circuit (IC) package, comprising:
    a first die, including an active layer opposite a backside surface of the first die supporting a plurality of backside pads;
    a package substrate coupled to the active layer, the package substrate comprising a plurality of package pads corresponding to the plurality of backside pads; and
    a passive device comprising a plurality of wire bonds coupled to the plurality of backside pads and the plurality of package pads.

2. An integrated circuit (IC) package, comprising:
    a die, including an active layer opposite a backside surface of the die, the active layer coupled to the backside surface of the die by through silicon vias (TSVs);
    a package substrate coupled to the active layer, the package substrate comprising a plurality of package pads corresponding to the plurality of backside pads; and
    a passive device comprising a plurality of wire bonds coupled to the package pads through the TSVs.

3. The IC package of claim 1, in which the passive device further comprises a die-to-die wire bond coupling one of the plurality of backside pads of the first die to a backside pad of a second die.

4. The IC package of claim 1, in which the plurality of wire bonds of the passive device couple backside pads of the first die to package pads associated with a second die on the package substrate.

5. The IC package of claim 4, in which the plurality of wire bonds couple backside pads of the first die to package pads associated with the second die and backside pads of the second die couple to package pads associated with a third die.

6. The IC package of claim 1, in which the passive device further comprises a plurality of through silicon vias (TSVs) coupled to at least two of the plurality of wire bonds.

7. The IC package of claim 1, in which the plurality of backside pads are laser trimmable pads.

8. The IC package of claim 1, in which the plurality of backside pads are curved.

9. The IC package of claim 8, in which the passive device further comprises a curved die trace between two curved pad.

10. A method of forming an inductor, comprising:
    forming a plurality of backside pads on a back side of a die;
    forming package bumps on a front side of the die;
    assembling the die on a package substrate comprising a plurality of package pads corresponding to the plurality of backside pads; and
    forming a passive device comprising coupling a wire bond between the plurality of backside pads and the plurality of package pads.

11. The method of claim 10, in which the coupling a wire bond between the plurality of backside pads and the plurality of package pads couples to an active layer by through silicon vias (TSVs).

12. The method of claim 10, further comprising coupling one of the plurality of backside pads of a first die to a backside pad of a second die.

13. The method of claim 12, further comprising coupling backside pads of the second die to backside pads associated with a third die.

14. The method of claim 10, in which the plurality of backside pads are laser trimmable pads.

15. The method of claim 10, in which forming the plurality of backside pads on a backside of the die forms curved pads.

16. An integrated circuit (IC) apparatus, comprising:
    means for forming a plurality of backside pads on a back side of a die;
    means for forming package bumps on a front side of the die;

means for assembling the die on a package substrate comprising a plurality of package pads corresponding to the plurality of backside pads; and means for forming a passive device comprising coupling a wire bond between the plurality of backside pads and the plurality of package pads.

17. The IC apparatus of claim 16, in which the means for coupling a wire bond between the plurality of backside pads and the plurality of package pads further comprises means for coupling to an active layer by through silicon vias (TSVs).

18. The IC apparatus of claim 16 further comprising means for coupling one of the plurality of backside pads of a first die to a backside pad of a second die.

19. The IC apparatus of claim 18 further comprising means for coupling backside pads of the second die to backside pads of a third die.

20. The IC apparatus of claim 16, in which the means for coupling a wire bond between the plurality of backside pads and the plurality of package pads uses laser trimmable pads.

* * * * *